(12) United States Patent
Li et al.

(10) Patent No.: US 12,089,324 B2
(45) Date of Patent: Sep. 10, 2024

(54) DISPLAY MODULE AND WEARABLE DEVICE

(71) Applicant: Beijing Xiaomi Mobile Software Co., Ltd., Beijing (CN)

(72) Inventors: Jinze Li, Beijing (CN); Ming Zhao, Beijing (CN)

(73) Assignee: BEIJING XIAOMI MOBILE SOFTWARE CO., LTD., Beijing (CN)

( * ) Notice: Subject to any disclaimer, the term of this patent is extended or adjusted under 35 U.S.C. 154(b) by 246 days.

(21) Appl. No.: 17/823,038

(22) Filed: Aug. 29, 2022

(65) Prior Publication Data

US 2023/0328879 A1 Oct. 12, 2023

(30) Foreign Application Priority Data

Apr. 8, 2022 (CN) .......................... 202210368824.9

(51) Int. Cl.
*H05K 1/02* (2006.01)
*G04G 17/04* (2006.01)
*H05K 1/11* (2006.01)

(52) U.S. Cl.
CPC .......... *H05K 1/028* (2013.01); *G04G 17/045* (2013.01); *H05K 1/0298* (2013.01); *H05K 1/115* (2013.01); *H05K 1/118* (2013.01); *H05K 2201/10128* (2013.01)

(58) Field of Classification Search
CPC ...... H05K 1/028; H05K 1/0298; H05K 1/115; H05K 1/118; H05K 2201/10128; G04G 17/045
USPC .......................................................... 361/749
See application file for complete search history.

(56) References Cited

U.S. PATENT DOCUMENTS

2017/0098668 A1\* 4/2017 Huitema ................. G06F 1/163
2019/0250669 A1\* 8/2019 Liao ...................... G04G 17/045

FOREIGN PATENT DOCUMENTS

CN 214802831 U 11/2021

\* cited by examiner

*Primary Examiner* — Andargie M Aychillhum
(74) *Attorney, Agent, or Firm* — McCoy Russell LLP

(57) ABSTRACT

The disclosure provides a display module and a wearable device. The display module includes a flexible display screen and a flexible printed circuit board. The flexible display screen includes a first side in a first direction and a second side in a second direction, the first side and the second side being each electrically connected to the flexible printed circuit board; and the flexible printed circuit board includes a first functional circuit and a second functional circuit, the first side being connected to the first functional circuit, and the second side being connected to the second functional circuit. The first direction is different from the second direction.

15 Claims, 7 Drawing Sheets

DISPLAY MODULE AND WEARABLE DEVICE

CROSS REFERENCE TO RELATED APPLICATIONS

The present application claims priority to Chinese Patent Application No. 202210368824.9, filed on Apr. 8, 2022. The entire contents of the above-listed application are hereby incorporated by reference for all purposes.

BACKGROUND

Owing to ongoing technical development, the display module of the wearable device at present is capable of displaying the information, images, etc. upon connection with the Internet through the smart phone or the home network, instead of merely displaying time. Except for the function of displaying the information and images, the display module also has a touch sensing function enabling interaction with the user.

SUMMARY

The disclosure relates to the technical field of wearable devices, and in particular to a display module and a wearable device.

In a first aspect, the disclosure provides a display module, including:
  a flexible display screen and a flexible printed circuit board; where the flexible display screen includes a first side in a first direction and a second side in a second direction, the first side and the second side being each electrically connected to the flexible printed circuit board; the flexible printed circuit board includes a first functional circuit and a second functional circuit, the first side being connected to the first functional circuit, and the second side being connected to the second functional circuit; and the first direction is different from the second direction.

In a second aspect, the disclosure provides a wearable device, including a housing and the display module according to any one of the examples described above, the display module being assembled on the housing.

It should be understood that the general descriptions above and the detailed descriptions below are merely illustrative and explanatory, and may not limit the disclosure.

BRIEF DESCRIPTION OF THE DRAWINGS

The accompanying drawings herein, which are incorporated in the description as a constituent part of the description, show examples consistent with the disclosure and are used to explain the principles of the disclosure together with the description.

DETAILED DESCRIPTION

The examples will be described in detail herein and shown in the accompanying drawings. When the following descriptions relate to the accompanying drawings, unless otherwise specified, the same numeral in different accompanying drawings denotes the same or similar element. The implementations described in the following examples do not denote all implementations consistent with the disclosure. On the contrary, they are merely examples of an apparatus and a method consistent with some aspects of the present disclosure.

The terms used in the disclosure are merely to describe the specific examples, instead of limiting the disclosure. Unless otherwise defined, technical or scientific terms used in the disclosure should be of ordinary meaning as understood by a person of ordinary skill in the art to which the disclosure pertains. Words "first", "second", etc. used in the description of the disclosure and claims do not denote any order, quantity, or importance, but are merely used for distinguishing between different components. Similarly, words "a", "an", etc. do not denote a limitation on quantity, but rather denote the presence of at least one. "A plurality of" or "several" denotes two or more. Unless otherwise indicated, words "front", "rear", "lower portion" and/or "upper portion" etc. are merely used for the ease of description, but are not limited to a position or a spatial orientation. Words "comprising", "encompassing" etc. are intended to mean that an element or item in front of "comprising" or "encompassing" includes elements or items and their equivalents that present behind "comprising" or "encompassing", but do not exclude other elements or items. The words "connection", "connected" etc. are not limited to a physical or mechanical connection, but may include an electrical connection, regardless of being direct or indirect.

The terms used in the disclosure are merely to describe the specific examples, instead of limiting the disclosure. The singular forms "a", "the", and "this" used in the disclosure and the appended claims are also intended to include the plural forms, unless otherwise clearly stated in the context. It should also be understood that the term "and/or" used herein refers to and encompasses any or all possible combinations of one or more of associated listed items.

In related art, the display areas of the display modules of some existing wearable devices are small, which is not conducive to the touch operations by the users.

The disclosure provides a display module and a wearable device, to expand a display area of the display module.

The disclosure provides a display module and a wearable device. The display module and the wearable device of the disclosure will be described in detail below with reference to the accompanying drawings. The features in the examples and the implementations described below may be combined with one another without conflict.

Figure 1:
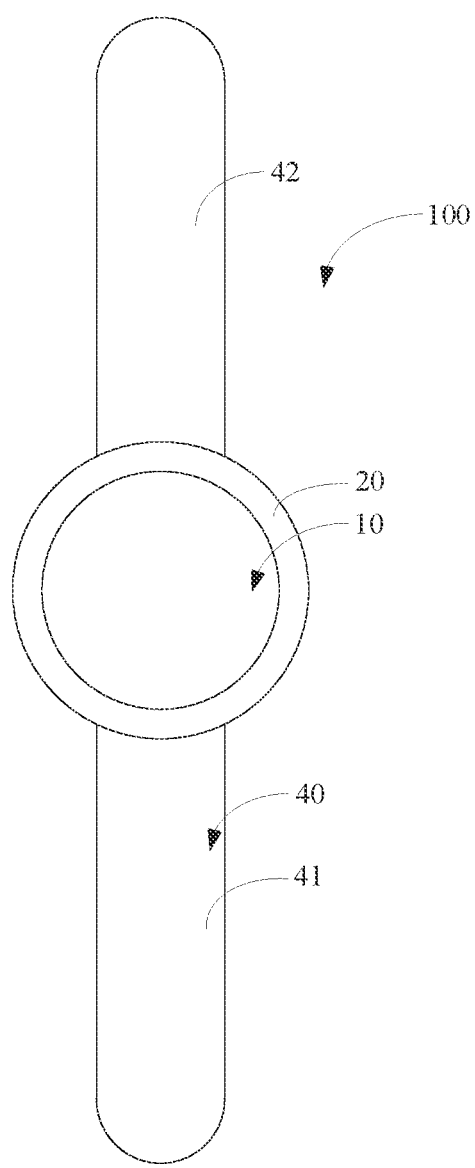
FIG. 1 is a schematic planar diagram of a wearable device in some examples of the disclosure.

As shown in FIG. 1, the disclosure provides a wearable device 100. The wearable device 100 may be a watch, or another apparatus worn on a wrist, such as a bracelet. The wearable device 100 includes a display module 10 and a housing 20, where the display module 10 may be circular, square or the like, and the housing 20 may have the same shape as the display module 10 or not, which is not limited by the disclosure. The display module 10 is assembled to the housing 20, so as to protect the display module 10. Alternatively, the display module 10 is assembled in a center of the housing 20, so that the wearable device 100 is more attractive structurally.

As shown in FIGS. 2 to 6, the disclosure provides a display module 10. The display module 10 includes a flexible printed circuit board 11 and a flexible display screen 12. Alternatively, the flexible display screen 12 is made of a flexible material, and the flexible display screen 12 may be an organic light-emitting diode (OLED) flexible display screen, a micro LED flexible display screen, a mini LED flexible display screen or the like. The following takes the flexible display screen 12 as an OLED flexible display screen as an example, and the OLED flexible display screen features self-luminescence, a wide viewing angle, low power consumption, a rapid response speed, etc. The flexible display screen 12 may include a display area (DA) for displaying a picture and a peripheral area (PA) (which may be understood as a non-display area) arranged around the display area DA. The flexible printed circuit board 11 may be simply referred to as a flexible board or flexible printed circuit (FPC), features high wiring density, a light weight, etc., and may be made of polyimide or polyester film.

Figure 2:
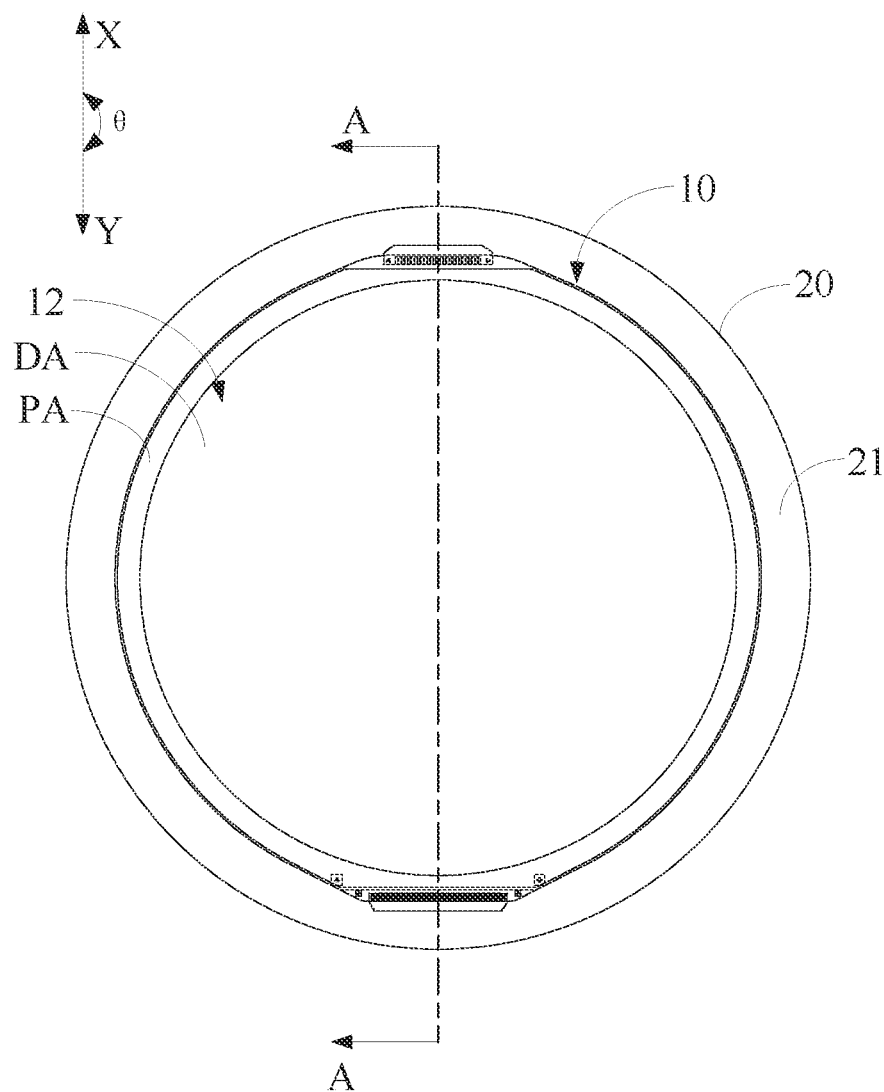
FIG. 2 is a schematic planar diagram of a display module of a wearable device in some examples of the disclosure.

The flexible display screen 12 includes a first side in a first direction X and a second side in a second direction Y, the first side and the second side being each electrically connected to the flexible printed circuit board 11; and the flexible printed circuit board 11 includes a first functional circuit 112 and a second functional circuit 113, the first side being connected to the first functional circuit 112, and the second side being connected to the second functional circuit 113. The first direction X is different from the second direction Y In this way, wires may be led out from two directions of the flexible display screen 12 and connected to the first functional circuit 112 and the second functional circuit 113, respectively, and a wire for the first functional circuit 112 and a wire for the second functional circuit 113 will not be entirely stacked at the same side of the display module 10, so that concentricity between the flexible printed circuit board 11 and the flexible display screen 12 is improved, a size of the peripheral area PA at an edge of the display module 10 may be reduced to expand the display area DA of the display module 10 and to bring a better experience effect to a user. It is understood that the flexible printed circuit board 11 may be connected to the flexible display screen 12 at the peripheral area PA. The first direction X is not limited to a vertically upward direction shown in FIG. 2, and the second direction Y is not limited to a vertically downward direction shown in FIG. 2. The first direction X and the second direction Y may be any directions directed in an axial direction of the display module 10 from a center of the display module 10, as shown in FIG. 2. The wires may be led out from the first side in the first direction X and the second side in the second direction Y of the flexible display screen 12 and electrically connected to the first functional circuit 112 and the second functional circuit 113 of the flexible printed circuit board 11, respectively, so that the wires of the flexible display screen 12 will not be entirely stacked at the same side, and the display module 10 has a better heat dissipation effect, and a more rational routing layout.

Figure 4:
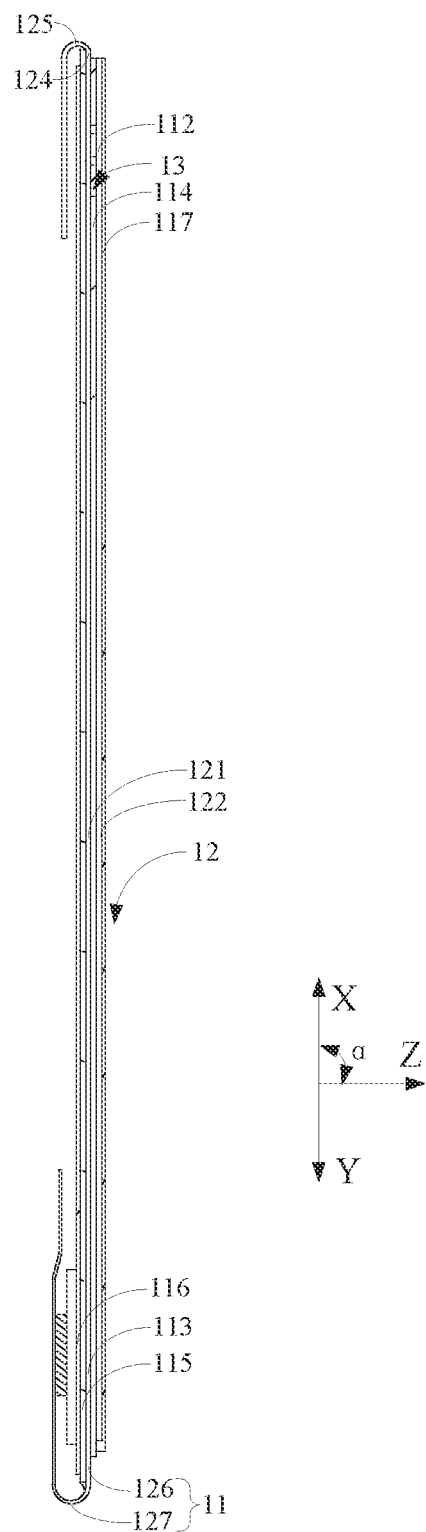
FIG. 4 is a sectional view, along a line A-A, of a display module of a wearable device in some examples of the disclosure.

In some examples, the first functional circuit 112 includes a touch driving circuit 1121, and the second functional circuit 113 includes a display driving circuit 1131. Accordingly, the flexible display screen 12 may include a display layer 121 (as shown in FIG. 4) and a touch layer 122 (as shown in FIG. 4). The display layer 121 is connected to the display driving circuit 1131, and the touch layer 122 is connected to the touch driving circuit 1121. The display layer 121 may realize a display function of the display module 10, and is used for displaying images, information, etc. The display area DA may be defined on the display layer 121. The touch layer 122 may obtain information such as whether the user touches the touch layer 122 and which portion of the touch layer 122 is touched by sensing changes in pressure, charge, illumination, etc.

The flexible printed circuit board 11 may further include other functional circuits, such as a piezoelectric circuit. Other functional circuits may be connected to other sides, different from the first side and the second side, of the flexible display screen 12 in other directions different from the first direction X and the second direction Y, which is not limited by the disclosure.

In some alternative examples, the flexible display screen 12 includes the display area DA, an annular black edge being provided between the display area DA and an inner wall of the housing 20. In the circumferential direction of the display module 10, the annular black edge has a uniform and equal width, so that uniformity of a distance between an edge of the display area DA of the display module 10 and the inner wall of the housing 20 in the circumferential direction of the display module 10 may be improved, the display area DA of the display module 10 may be concentric with the housing 20, to improve the concentricity of the wearable device 100, and to make an entire wearable device 100 more harmonious and attractive.

In some alternative examples, the housing 20 is provided with an accommodation cavity 21, the display module 10 is assembled in the accommodation cavity 21, and the annular black edge is formed between the display area DA and an inner wall of the accommodation cavity 21. The accommodation cavity 21 may better accommodate the display module 10, so that the display module 10 is better assembled in the housing 20. The display area DA of the display module 10 is exposed out of the housing 20, and other portions of the display module 10 are accommodated in the accommodation cavity 21, so that the display module 10 may be better protected, and damages from a friction and a collision to the display module 10 may be reduced or eliminated. A center of the housing 20 may coincide with that of the display module 10. The wires may be led out from the first side in the first direction X and the second side in the second direction Y of the flexible display screen 12 respectively and connected to the flexible printed circuit board 11. Compared with a mode that the flexible display screen leads out the wires from one side, so that the peripheral area PA between the flexible printed circuit board 11 and the flexible display screen 12 in an axial direction of the display module 10 is narrowed, and a smaller portion protrudes from the flexible display screen 12. In this way, after the display module 10 is assembled on the housing 20, the annular black edge may have the uniform and equal width. In other words, in the circumferential direction of the display area DA, the peripheral area PA of the display module 10 has a more uniform width throughout, which may improve consistency of a distance between an outer edge of the display module 10 and the housing 20, to reduce a frame size of the wearable device 100, to realize a greater display effect of the wearable device 100, and further to bring a better experience effect to the user. Moreover, the concentricity of the display module 10 is improved, so that the display area DA of the display module 10 may be more concentric with the housing 20, to improve the concentricity of the wearable device 100, and to make the entire wearable device 100 more harmonious and attractive. In addition, the remaining space between the accommodation cavity 21 and the display module 10 is fully utilized for routing, so that the wearable device 100 has a more rational routing layout.

In some alternative examples, the wearable device 100 includes a main board 30. The main board 30 may be a rectangular circuit board. The main board 30 is arranged in the housing 20 or the display module 10. The main board 30 is arranged in the display module 10, so that the wearable device 100 may be of a more compact structure. The main board 30 is arranged in the housing 20, so that a certain distance is provided between the main board 30 and the display module 10, and a heat dissipation effect is better. The main board 30 is connected to the flexible printed circuit board 11, to transmit information and to supply power.

In some alternative examples, the flexible printed circuit board 11 is provided with a connector 111, the connector 111 being connected to the main board 30. The connector 111 is connected to the main board 30, to connect the flexible printed circuit board 11 to the main board 30. A simple connection manner is provided to facilitate an operation. The connector 111 may be connected to the main board 30 in a snap-fit, gluing, or a socket-plug manner, which is not limited by the disclosure.

Further as shown in FIG. 1, in some alternative examples, the wearable device 100 further includes wristbands 40, the wristbands 40 being connected to the housing 20. The wristbands 40 may be non-detachably connected to the housing 20, for example, the wristbands 40 and the housing 20 may be integrally provided, or the wristbands are detachably connected to the housing 20. For example, the wristbands are fixed on the housing 20 through spring bars. The wristbands 40 include a first wristband 41 and a second wristband 42. Alternatively, the first wristband 41 and the second wristband 42 are symmetrically arranged on two sides of the housing 20 with respect to a central axis of the display module 10, so that the first wristband 41 and the second wristband 42 may be worn conveniently. The first wristband 41 is arranged on a first side, in the first direction X, of the housing 20. The second wristband 42 is arranged on a second side, in the second direction Y, of the housing 20. In this way, a space at a joint between the first wristband 41 and the housing 20 and a space at a joint between the second wristband 42 and the housing 20 may be utilized for routing, so that the volume of the display module 10 may be increased, and the display area DA of the display module 10 may be further expanded.

As shown in FIGS. 2 to 5, in some alternative examples, on a plane formed by the first direction X and the second direction Y, a first included angle θ is formed between the first direction X and the second direction Y. The first included angle θ may be greater than 0° and less than or equal to 180°. In this way, the wires may be led out from the first side in the first direction X and the second side in the second direction Y of the flexible display screen 12 respectively and connected to the flexible printed circuit board 11, so that the wires of the flexible display screen 12 will not be entirely stacked at the same side, and a heat dissipation effect is better. Alternatively, the first included angle θ is 90°. As shown in FIG. 2, the first direction X may point to an upper side or a lower side of the flexible display screen 12, and the second direction Y may point to a left side or a right side of the flexible display screen 12, so that the flexible display screen 12 has a large distance between a wire outlet position of the first side in the first direction X and a wire outlet position of the second side in the second direction Y, and a heat dissipation effect is good. Alternatively, the first included angle θ is 180°. As shown in FIG. 2, the wires may be led out from two opposite sides (the upper side and the lower side shown in FIG. 2) of the flexible display screen 12, so that the flexible display screen 12 has the largest distance between a wire outlet position of the first side in the first direction X and a wire outlet position of the second side in the second direction Y, a heat dissipation effect is the best, and the routing space is the largest.

Figure 5:
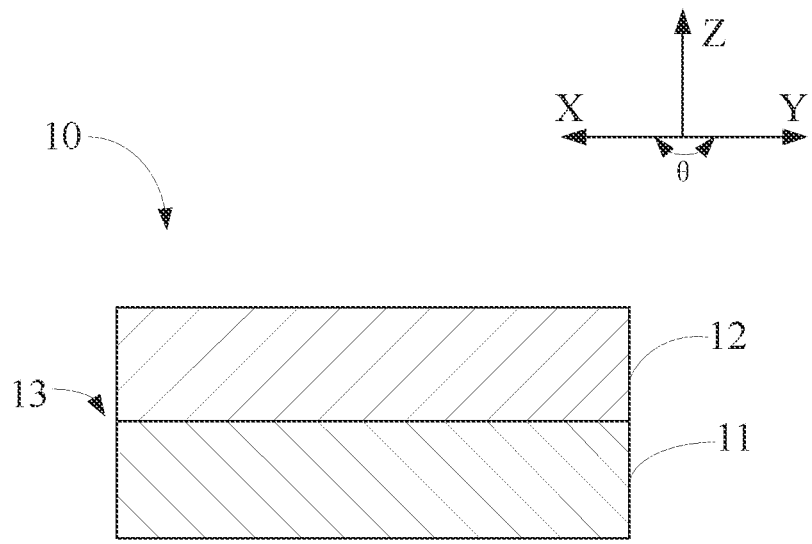
FIG. 5 is a structural schematic diagram of a display module of a wearable device in some examples of the disclosure.
Figure 6:
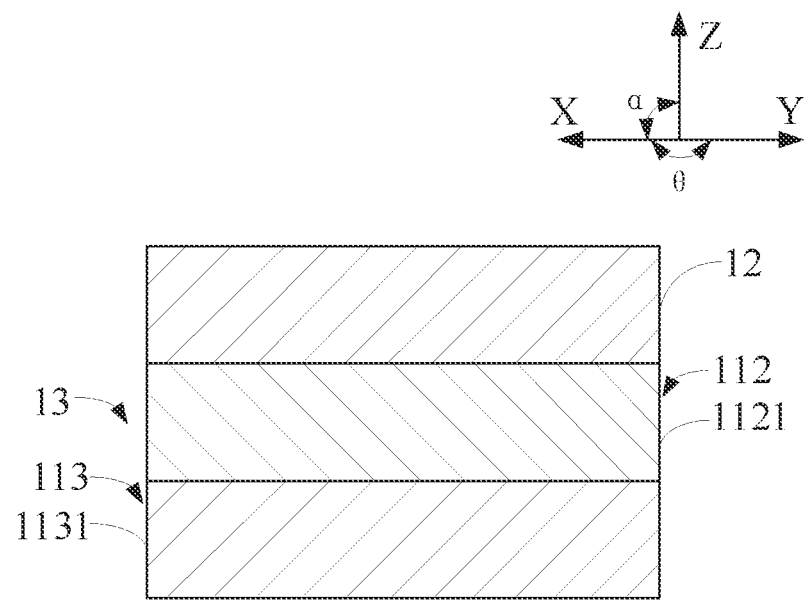
FIG. 6 is another structural schematic diagram of a display module of a wearable device in some examples of the disclosure.
Figure 7:
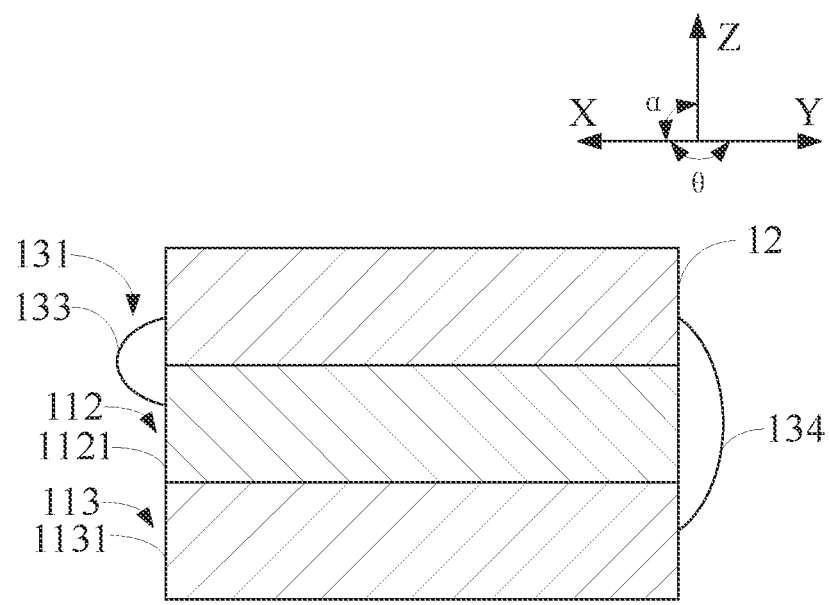
FIG. 7 is another structural schematic diagram of a display module of a wearable device in some examples of the disclosure.
Figure 8:
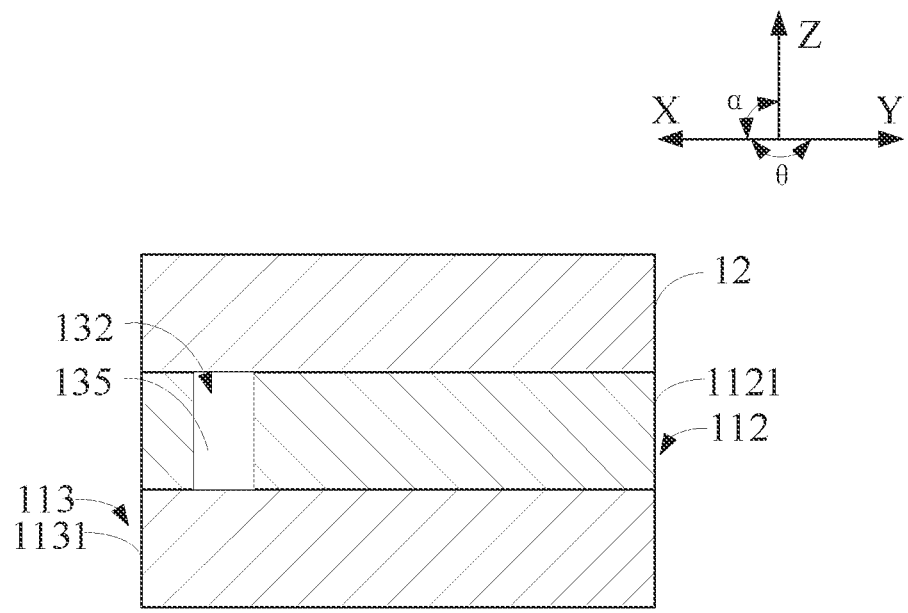
FIG. 8 is another structural schematic diagram of a display module of a wearable device in some examples of the disclosure.

As shown in FIG. 5, in some alternative examples, the display module 10 may further include a lead structure 13. The flexible printed circuit board 11 is electrically connected to the first side, in the first direction X, of the flexible display screen 12 through the lead structure 13. The flexible printed circuit board 11 is electrically connected to the second side, in the second direction Y, of the flexible display screen 12 through the lead structure 13. The flexible printed circuit board 11 may be connected to the flexible display screen 12 through the lead structures 13, with a simple connection manner and high reliability. Connections described herein may be either direct connections or indirect connections. Alternatively, the lead structure 13 may include at least one of a lead portion 131 (as shown in FIG. 7) and a via hole connection portion 132 (as shown in FIG. 8). The number of the lead portion 131 and the number of the via hole connection portion 132 are not limited, and the lead structure 13 may also be another structure, as long as the flexible printed circuit board 11 may be connected to the flexible display screen 12, which is not specifically limited by the disclosure. A via hole of the via hole connection portion 132 may be a through hole, a buried hole or the like. The flexible printed circuit board 11 may be connected to the flexible display screen 12 through the lead portion 131, with a simple connection manner. The flexible printed circuit board 11 may also be connected to the flexible display screen 12 through the via hole connection portion 132. The via hole connection portion 132 results in a small occupied area, so that the size of the peripheral area PA at the edge of the display module 10 may be further reduced, that is, the size of the peripheral area PA may be further reduced to expand the display area DA of the display module and to bring a better experience effect to the user.

In some alternative examples, a lead of the first functional circuit 112 is bunched at the first side, and a lead of the second functional circuit 113 is bunched at the second side, the first side and the second side being symmetrically arranged with respect to a center of the flexible display screen 12. In this way, the lead of the first functional circuit 112 and the lead of the second functional circuit 113 will not be entirely stacked at the same side of the display module 10, so that the lead of the first functional circuit 112 is spaced from the lead of the second functional circuit 113 to the greatest extent, the heat dissipation effect is the best, and the routing space is the largest. In some examples, the flexible display screen 12 may be circular, that is, the flexible display screen 12 is symmetrically arranged with respect to a center of a circle of the flexible display screen.

In some alternative examples, the first functional circuit 112 is stacked on the second functional circuit 113, and the flexible display screen 12 is stacked on one of the first functional circuit 112 and the second functional circuit 113. The first functional circuit 112, the second functional circuit 113, and the flexible display screen 12 are stacked, so that the lead of the first functional circuit 112 and the lead of the second functional circuit 113 will not be concentrated at the same plane, which is conducive to routing of the first functional circuit 112 and the second functional circuit 113.

In some examples, the first functional circuit 112 includes the touch driving circuit 1121, and the second functional circuit 113 includes the display driving circuit 1131. The touch driving circuit 1121 is stacked on the display driving circuit 1131, and the flexible display screen 12 is stacked on one side, away from the touch driving circuit 1121, of the display driving circuit 1131.

It is to be understood that the flexible display screen 12 is electrically connected to a first side, in the first direction X, of the touch driving circuit 1121 through the lead structure 13, and the flexible display screen 12 is electrically connected to a second side, in the second direction Y, of the display driving circuit 1131 through the lead structure 13. The display driving circuit 1131 and the touch driving circuit 1121 are connected to the main board 30 through the connector 111. The main board 30 may supply power to the display driving circuit 1131 and the touch driving circuit 1121 and transmit information between them.

Alternatively, the touch driving circuit 1121 is stacked on the display driving circuit 1131 in a third direction Z, a second included angle α being formed between the third direction Z and the first direction X. The second included angle α may be greater than 0° and less than or equal to 90°. The touch driving circuit 1121 is connected to the display driving circuit 1131 in the third direction Z, so that the flexible display screen 12 may realize both a display function and a touch sensing function.

As shown in FIG. 7, in some alternative examples, the lead portion 131 of the lead structure 13 may include a first lead portion 133 and a second lead portion 134. The flexible display screen 12 is electrically connected to the first side, in the first direction X, of the touch driving circuit 1121 through the first lead portion 133. The flexible display screen 12 is electrically connected to the second side, in the second direction Y, of the display driving circuit 1131 through the second lead portion 134. In this way, the first lead portion 133 and the second lead portion 134 are led out from the touch driving circuit 1121 and the display driving circuit 1131 in the first direction X and the second direction Y, respectively and electrically connected to the flexible display screen 12, and the lead structure 13 will not be entirely stacked at the same side of the display module 10, so that the concentricity between the flexible display screen 12 and the flexible printed circuit board 11 is improved, and the size of the non-display area at the edge of the display module 10 may be reduced to expand the display area DA of the display module and to bring a better experience effect to the user.

As shown in FIG. 8, in some alternative examples, one, close to the flexible display screen 12, of the first functional circuit 112 and the second functional circuit 113 is provided with a first via hole connection portion 135, and one, away from the flexible display screen 12, of the first function circuit 112 and the second function circuit 113 is electrically connected to the flexible display screen 12 through the first via hole connection portion 135. A connection through the first via hole connection portion 135 results in a small occupied area, so that the size of the peripheral area PA at the edge of the display module 10 may be further reduced. The first via hole connection portion 135 connects the one, away from the flexible display screen 12, of the first functional circuit 112 and the second functional circuit 113 to the flexible display screen 12, with a simple connection manner and high reliability. In some examples, the first via hole connection portion 135 is provided in the touch driving circuit 1121, and the display driving circuit 1131 is electrically connected to the flexible display screen 12 through the first via hole connection portion 135, so that the display driving circuit 1131 and the touch driving circuit 1121 are electrically connected to the flexible display screen 12. With the simple connection manner and the high reliability, the display driving circuit 1131, the touch driving circuit 1121, and the flexible display screen 12 may be electrically connected to one another by connecting printed wires among them. In this way, the peripheral area PA, in the second direction Y, of the flexible display screen 12 is further narrowed to expand the display area DA and to improve the concentricity of the display module 10.

Figure 9:
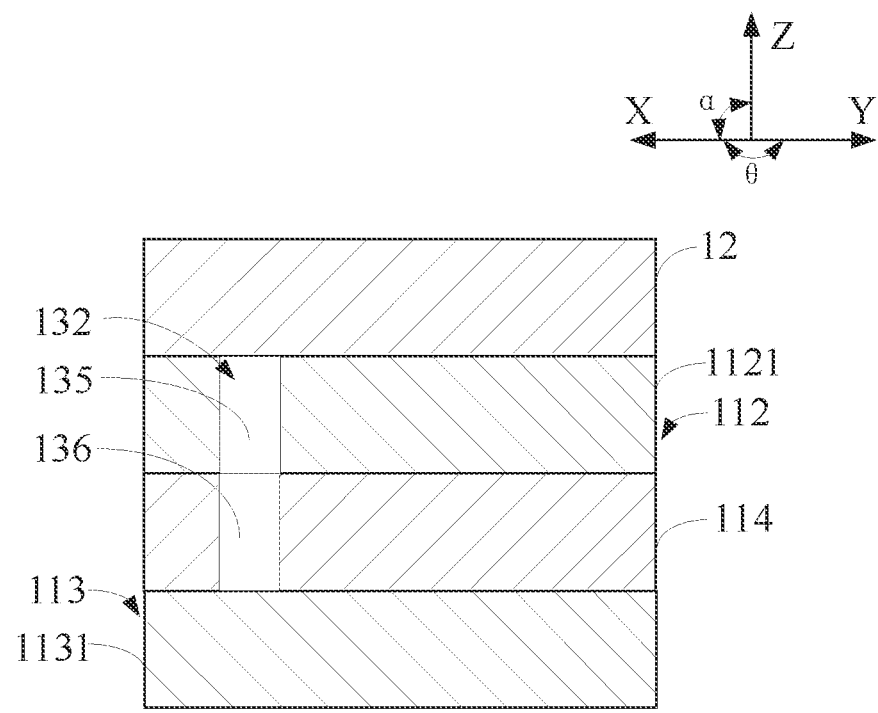
FIG. 9 is another structural schematic diagram of a display module of a wearable device in some examples of the disclosure.

As shown in FIG. 9, in some alternative examples, the display module 10 may further include a first base plate 114. The first base plate 114 may employ thin film encapsulation (TFE), to support and protect the first functional circuit 112 and the second functional circuit 113. The first base plate 114 is arranged between the first functional circuit 112 and the second functional circuit 113, and the first base plate 114 is provided with a second via hole connection portion 136. The first functional circuit 112 is electrically connected to the second functional circuit 113 through the second via hole connection portion 136, to electrically connect the first functional circuit 112 and the second functional circuit 113 to the flexible display screen 12, with a simple connection manner and high reliability. In some examples, the first base plate 114 is arranged between the display driving circuit 1131 and the touch driving circuit 1121. The first base plate 114 is provided with the second via hole connection portion 136, and the touch driving circuit 1121 is electrically connected to the display driving circuit 1131 through the second via hole connection portion 136, to electrically connect the display driving circuit 1131 and the touch driving circuit 1121 to the flexible display screen 12.

Figure 10:
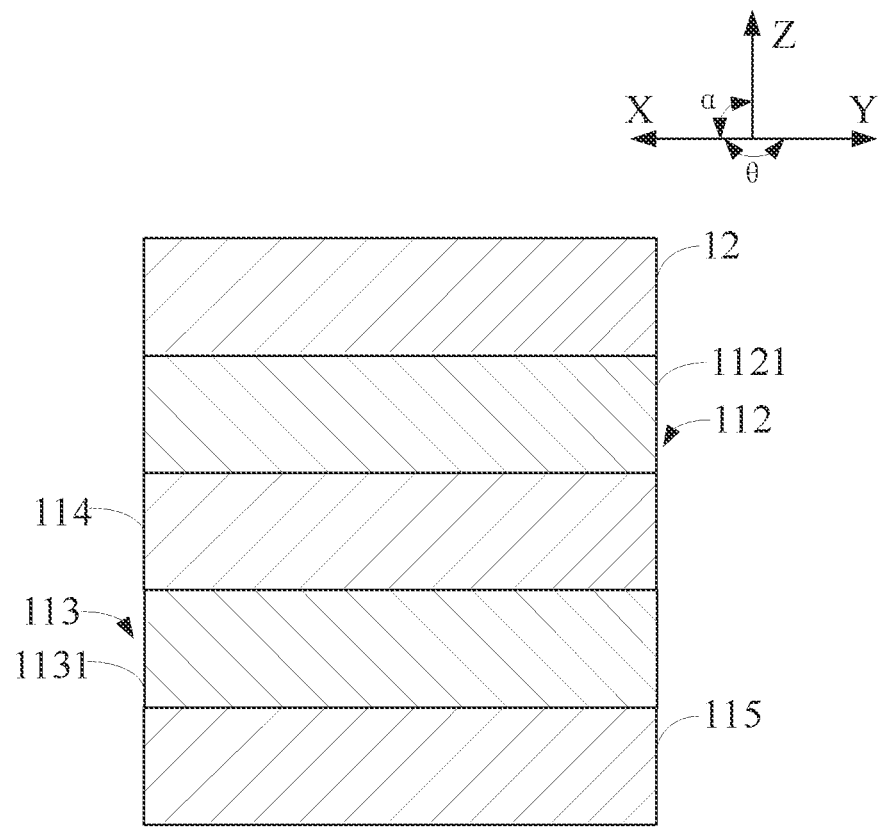
FIG. 10 is another structural schematic diagram of a display module of a wearable device in some examples of the disclosure.

As shown in FIG. 10, in some alternative examples, the display module 10 may further include a second base plate 115, the second base plate 115 being arranged on one sides, away from the flexible display screen 12, of the first functional circuit 112 and the second functional circuit 113. The second base plate 115 may be PI base plate, to support and protect the display driving circuit 1131. In some examples, the second base plate 115 is arranged on one side, away from the flexible display screen 12, of the display driving circuit 1131. Since the second base plate 115 plays a role in supporting, positions of the touch driving circuit 1121 and the display driving circuit 1131 may be limited, and a situation that the display driving circuit 1131 and the touch driving circuit 1121 move relative to each other due to collision, etc., affecting an effect of an electrical connection between the display driving circuit 1131 and the touch driving circuit 1121 is avoided.

Figure 3:
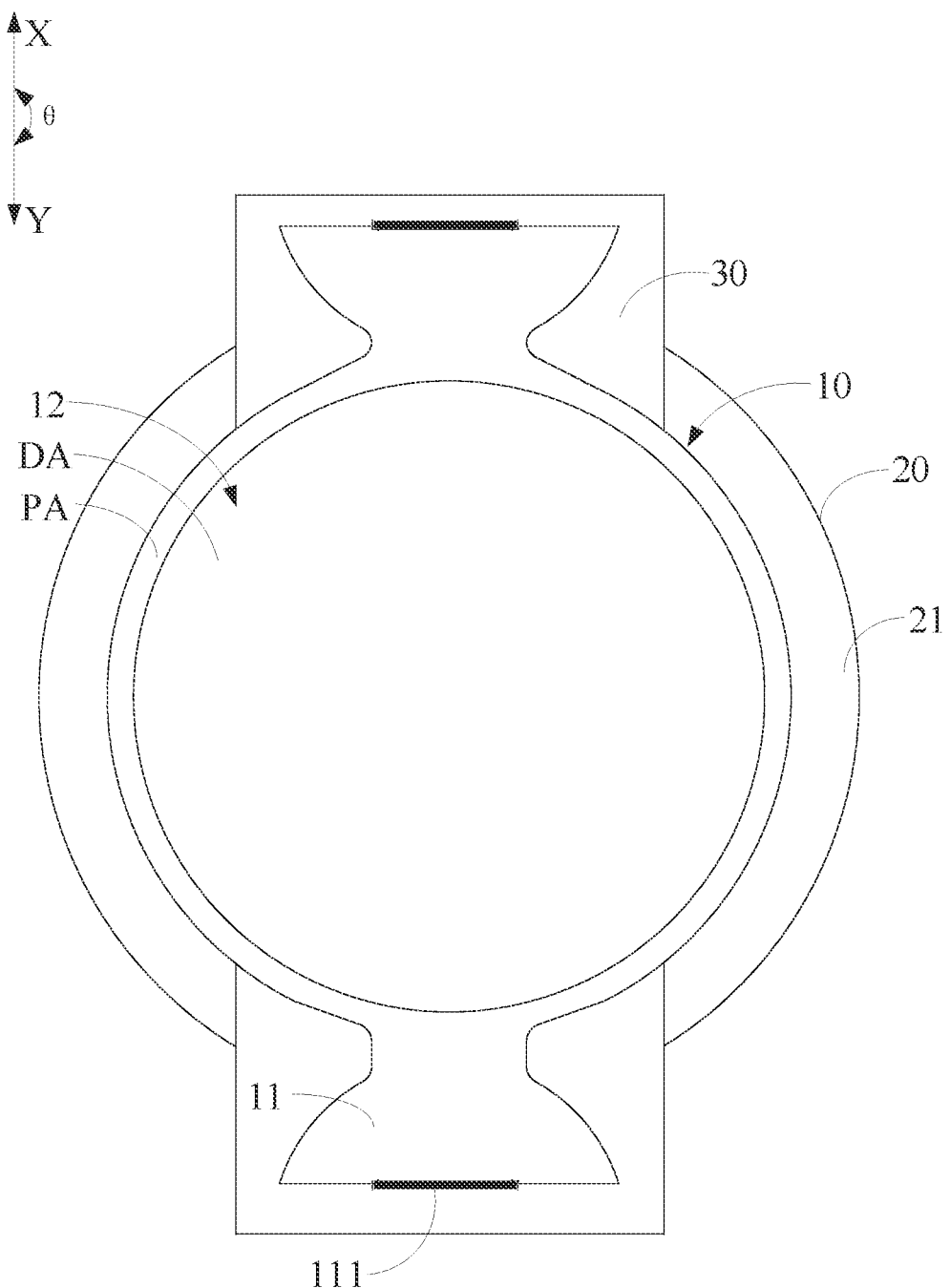
FIG. 3 is a schematic expanded planar diagram of a display module of a wearable device in some examples of the disclosure.

Further as shown in FIGS. 2 to 4, in some alternative examples, the flexible printed circuit board 11 includes a first body 124 and a first bent portion 125 arranged in the first direction X. One end of the first bent portion 125 is connected to the first body 124, and the other end of the first bent portion 125 is bent relative to the first body 124 towards a direction away from the first functional circuit 112. The first bent portion 125 is arranged to reduce size, in the first direction X, of the peripheral area PA between the flexible display screen 12 and the flexible printed circuit board 11, and the peripheral area PA is smaller, to expand the display area DA of the flexible display screen 12, to bring a better experience effect to the user, and further to make a structure in the display module 10 more compact. Similarly, in some alternative examples, the flexible printed circuit board 11 includes a second body 126 and a second bent portion 127 arranged in the second direction Y. One end of the second bent portion 127 is connected to the second body 126, and the other end of the second bent portion 127 is bent relative to the second body 126 towards a direction away from the first functional circuit 112. The second bent portion 127 is arranged to reduce the size, in the second direction Y, of the peripheral area PA between the flexible display screen 12 and the flexible printed circuit board 11.

In some alternative examples, an end surface of the first body 124 is flush with that of the second base plate 115, and an end surface of the second body 126 is flush with that of the second base plate 115. That is, a connection surface between the first body 124 and the first bent portion 125 is flush with the end surface of the second base plate 115, and the first bent portion 125 is bent at the end surface of the second base plate 115. A connection surface between the second body 126 and the second bent portion 127 is flush with the end surface of the second base plate 115, and the second bent portion 127 is bent at the end surface of the second base plate 115. As shown in FIG. 4, compared with a case that the end surface of the first body 124 is at an upper side of an end surface of the first base plate 114, such an arrangement may reduce the size, in the first direction X, of the peripheral area PA between the flexible display screen 12 and the flexible printed circuit board 11, so that the peripheral area PA is smaller, to expand the display area DA for displaying a picture of the flexible display screen 12. Compared with a case that the end surface of the first body 124 is at a lower side of the end surface of the first base plate 114, such an arrangement may reduce or eliminate a friction between the first bent portion 125 and the first base plate 114, and prevent the first bent portion 125 from being damaged by the friction. Similarly, compared with a case that the end surface of the second body 126 is at the lower side of the end surface of the first base plate 114, such an arrangement may reduce the size, in the second direction Y, of the peripheral area PA between the flexible display screen 12 and the flexible printed circuit board 11. Compared with a case that the end surface of the second body 126 is at the upper side of the end surface of the first base plate 114, such an arrangement may reduce or eliminate a friction between the second bent portion 127 and the first base plate 114, and prevent the second bent portion 127 from being damaged by the friction.

Further as shown in FIG. 4, in some alternative examples, the display module 10 further includes a substrate layer 116. The substrate layer 116 includes one or more of foam, a graphite layer, and copper foil, and the substrate layer 116 is arranged on one side, away from the display layer 121, of the second base plate 115. The substrate layer 116 may be used for supporting the second base plate 115, the display layer 121, the touch layer 122, etc. Moreover, the substrate layer 116 may also facilitate heat dissipation of the second base plate 115, the display layer 121, the touch layer 122, etc.

In some alternative examples, the display module 10 further includes an anti-reflection layer 117. The anti-reflection layer 117 may include a polarizer, a color filter, or other optical film layer that capable of reducing reflectivity. The anti-reflection layer 117 is arranged on one side, away from the display layer 121, of the touch layer 122. The anti-reflection layer 117 may be attached to one side, away from the display layer 121, of the touch layer 122 through transparent optical adhesive, etc. External light passes through the anti-reflection layer 117 and then is incident on the display layer 121. The anti-reflection layer 117 may absorb some external light, to prevent the external light from being reflected by metal lines in the display layer 121, so as to improve a contrast of the display module 10.

In some alternative examples, the display module 10 may further include a cover plate (not shown) arranged on one side, away from the touch layer 122, of the anti-reflection layer 117. The cover plate may be attached to the one side, away from the touch layer 122, of the anti-reflection layer 117 through transparent optical adhesive, etc. The cover plate may be arranged on the outermost side, for protecting internal structures such as the display layer 121, the touch layer 122, and the anti-reflection layer 117.

Other implementation solutions to the disclosure will be easily conceived by those skilled in the art in consideration of the description and practice of the disclosure disclosed herein. The disclosure is intended to cover any variations, uses or adaptive changes of the disclosure, which follow the general principles of the disclosure and include common general knowledge or conventional technical means that is not disclosed in the disclosure, in the art. The description and the examples are merely deemed illustrative, and the true scope and spirit of the disclosure are indicated by the following claims.

It should be understood that the disclosure is not limited to a precise structure which has been described above and illustrated in the accompanying drawings, and may have various modifications and changes without departing from the scope of the disclosure. The scope of the disclosure is limited by the appended claims only.

In some examples, the disclosure provides a display module, the display module including:
  a flexible display screen and a flexible printed circuit board; where the flexible display screen includes a first side in a first direction and a second side in a second direction, the first side and the second side being each electrically connected to the flexible printed circuit board; the flexible printed circuit board includes a first functional circuit and a second functional circuit, the first side being connected to the first functional circuit, and the second side being connected to the second functional circuit; and the first direction is different from the second direction.

In some examples, a lead of the first functional circuit is bunched at the first side, and a lead of the second functional circuit is bunched at the second side, the first side and the second side being symmetrically arranged with respect to a center of the flexible display screen.

In some examples, the first functional circuit is stacked on the second functional circuit, and the flexible display screen is stacked on one of the first functional circuit and the second functional circuit.

In some examples, one, close to the flexible display screen, of the first functional circuit and the second functional circuit is provided with a first via hole connection portion, and one, away from the flexible display screen, of the first functional circuit and the second functional circuit is electrically connected to the flexible display screen through the first via hole connection portion.

In some examples, the display module further includes a first base plate, the first base plate being arranged between the first functional circuit and the second functional circuit; and the first base plate is provided with a second via hole connection portion, the first functional circuit being electrically connected to the second functional circuit through the second via hole connection portion.

In some examples, the display module further includes a second base plate, the second base plate being arranged on one sides, away from the flexible display screen, of the first functional circuit and the second functional circuit.

In some examples, the first functional circuit includes a touch driving circuit, and the second functional circuit includes a display driving circuit.

In some examples, a first included angle is formed between the first direction and the second direction.

In some examples, the disclosure provides a wearable device, including a housing and the display module according to any display module as described above, the display module being assembled on the housing.

In some examples, a flexible display screen includes a display area, an annular black edge being arranged between the display area and an inner wall of the housing, and in a circumferential direction of the display module, the annular black edge having a uniform and equal width.

The invention claimed is:

1. A display module, comprising a flexible display screen and a flexible printed circuit board; wherein the flexible display screen comprises a first side in a first direction and a second side in a second direction, the first side and the second side being each electrically connected to the flexible printed circuit board; the flexible printed circuit board comprises a first functional circuit and a second functional circuit, the first side being connected to the first functional circuit, and the second side being connected to the second functional circuit; and the first direction is different from the second direction, wherein a lead of the first functional circuit is bunched at the first side, and a lead of the second functional circuit is bunched at the second side, the first side and the second side being symmetrically arranged with respect to a center of the flexible display screen.

2. The display module according to claim 1, wherein the first functional circuit is stacked on the second functional circuit, and the flexible display screen is stacked on one of the first functional circuit and the second functional circuit.

3. The display module according to claim 1, wherein one, close to the flexible display screen, of the first functional circuit and the second functional circuit is provided with a first via hole connection portion, and one, away from the flexible display screen, of the first functional circuit and the second functional circuit is electrically connected to the flexible display screen through the first via hole connection portion.

4. The display module according to claim 1, further comprising a first base plate, the first base plate being arranged between the first functional circuit and the second functional circuit; and the first base plate is provided with a second via hole connection portion, the first functional circuit being electrically connected to the second functional circuit through the second via hole connection portion.

5. The display module according to claim 1, further comprising a second base plate, the second base plate being arranged on one sides, away from the flexible display screen, of the first functional circuit and the second functional circuit.

6. The display module according to claim 1, wherein the first functional circuit comprises a touch driving circuit, and the second functional circuit comprises a display driving circuit.

7. The display module according to claim 1, wherein a first included angle is formed between the first direction and the second direction.

8. A wearable device, comprising a housing and a display module, the display module being assembled on the housing, the display module comprising a flexible display screen and a flexible printed circuit board; wherein the flexible display screen comprises a first side in a first direction and a second side in a second direction, the first side and the second side being each electrically connected to the flexible printed circuit board; the flexible printed circuit board comprises a first functional circuit and a second functional circuit, the first side being connected to the first functional circuit, and the second side being connected to the second functional circuit; and the first direction is different from the second direction, wherein a lead of the first functional circuit is bunched at the first side, and a lead of the second functional circuit is bunched at the second side, the first side and the second side being symmetrically arranged with respect to a center of the flexible display screen.

9. The wearable device according to claim 8, wherein the flexible display screen comprises a display area, an annular black edge being arranged between the display area and an inner wall of the housing, and in a circumferential direction of the display module, the annular black edge having a uniform and equal width.

10. The wearable device according to claim 8, wherein the first functional circuit is stacked on the second functional circuit, and the flexible display screen is stacked on one of the first functional circuit and the second functional circuit.

11. The wearable device according to claim 8, wherein one, close to the flexible display screen, of the first functional circuit and the second functional circuit is provided with a first via hole connection portion, and one, away from the flexible display screen, of the first functional circuit and the second functional circuit is electrically connected to the flexible display screen through the first via hole connection portion.

12. The wearable device according to claim 8, further comprising a first base plate, the first base plate being arranged between the first functional circuit and the second functional circuit; and the first base plate is provided with a second via hole connection portion, the first functional circuit being electrically connected to the second functional circuit through the second via hole connection portion.

13. The wearable device according to claim 8, further comprising a second base plate, the second base plate being arranged on one sides, away from the flexible display screen, of the first functional circuit and the second functional circuit.

14. The wearable device according to claim 8, wherein the first functional circuit comprises a touch driving circuit, and the second functional circuit comprises a display driving circuit.

15. The wearable device according to claim 8, wherein a first included angle is formed between the first direction and the second direction.

* * * * *